US 11,428,478 B2

(12) United States Patent
Zhou et al.

(10) Patent No.: US 11,428,478 B2
(45) Date of Patent: Aug. 30, 2022

(54) FIN GEOMETRIES FOR MANIFOLD MICROCHANNEL HEAT SINKS

(71) Applicant: TOYOTA MOTOR ENGINEERING & MANUFACTURING NORTH AMERICA, INC., Plano, TX (US)

(72) Inventors: Yuqing Zhou, Ann Arbor, MI (US); Ercan M. Dede, Ann Arbor, MI (US); Tsuyoshi Nomura, Novi, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 191 days.

(21) Appl. No.: 16/777,315

(22) Filed: Jan. 30, 2020

(65) Prior Publication Data

US 2021/0180880 A1    Jun. 17, 2021

Related U.S. Application Data

(60) Provisional application No. 62/948,544, filed on Dec. 16, 2019.

(51) Int. Cl.
*F28F 3/04* (2006.01)
*F28F 3/12* (2006.01)
(Continued)

(52) U.S. Cl.
CPC .................. *F28F 3/04* (2013.01); *F28F 3/12* (2013.01); *H05K 7/20254* (2013.01); *B33Y 80/00* (2014.12); *F28F 2260/02* (2013.01)

(58) Field of Classification Search
CPC ............ F28F 3/04; F28F 3/12; F28F 2260/02; H05K 7/20254; B33Y 80/00; F21V 29/75;
(Continued)

(56) References Cited

U.S. PATENT DOCUMENTS 7,353,859 B2    4/2008  Stevanovic et al.
8,243,451 B2 *  8/2012  Dede .................. F28F 13/08
                                                361/702
(Continued)

FOREIGN PATENT DOCUMENTS

CN          107146938 A        9/2017

OTHER PUBLICATIONS

Ling Xu, et al.; "Design Of Microchannel Heat Sink Using Topology Optimization For High Power Modules Cooling" Sep. 21, 2017; 3 pgs.; (https://ieeexplore.ieee.org/document/8046632).
(Continued)

*Primary Examiner* — Justin M Jonaitis
(74) *Attorney, Agent, or Firm* — Dinsmore & Shohl LLP

(57) ABSTRACT

Embodiments disclosed herein describe manifold microchannel heat sinks having a gridded microchannel assembly with free-form fin geometries for cooling heat-generating devices in the electronics modules. In an embodiment, a manifold microchannel heat sink includes a target surface and a gridded microchannel assembly comprising a plurality of microchannel cells. Each microchannel cell is surrounded by thermally-conductive sidewalls and includes a fluid inlet, a microchannel structure fluidly coupled to the fluid inlet and a fluid outlet. The microchannel structure extends from the target surface and defines a microchannel extending in a normal direction with respect to the target surface. The microchannel structure includes a base plate disposed on the target surface and a three-dimensional fin structure disposed on the base plate. The three-dimensional fin structure has a shape optimized for thermal performance and fluid performance.

20 Claims, 9 Drawing Sheets

(51) Int. Cl.
*H05K 7/20* (2006.01)
*B33Y 80/00* (2015.01)

(58) Field of Classification Search
CPC ... H01L 23/467; H01L 23/473; H01L 23/427; H01L 2924/0002
USPC ........................................................ 165/166
See application file for complete search history.

(56) References Cited

U.S. PATENT DOCUMENTS

| | | |
|---|---|---|
| 8,474,516 B2 | 7/2013 | Valenzuela |
| 9,247,679 B2* | 1/2016 | Joshi .................. H05K 7/20927 |
| 10,422,588 B2 | 9/2019 | Smith et al. |
| 2006/0120213 A1 | 6/2006 | Tonkovich et al. |
| 2008/0264616 A1 | 10/2008 | Deschodt et al. |
| 2012/0063091 A1* | 3/2012 | Dede .................. H05K 7/20927 |
| | | 361/699 |
| 2017/0170222 A1* | 6/2017 | Toda .................. H01L 27/14634 |
| 2018/0145009 A1* | 5/2018 | Fukuoka ............. H01L 23/3677 |
| 2019/0181717 A1* | 6/2019 | Zhou ...................... H02K 11/33 |

OTHER PUBLICATIONS

David T.W. Lin et al.; "Optimization of the Micro Channel Heat Sink by Combing Genetic Algorithm With the Finite Element Method"; Institute of Mechatronic System Engineering, National University of Tainan; May 22, 2018; 13 pgs.

* cited by examiner

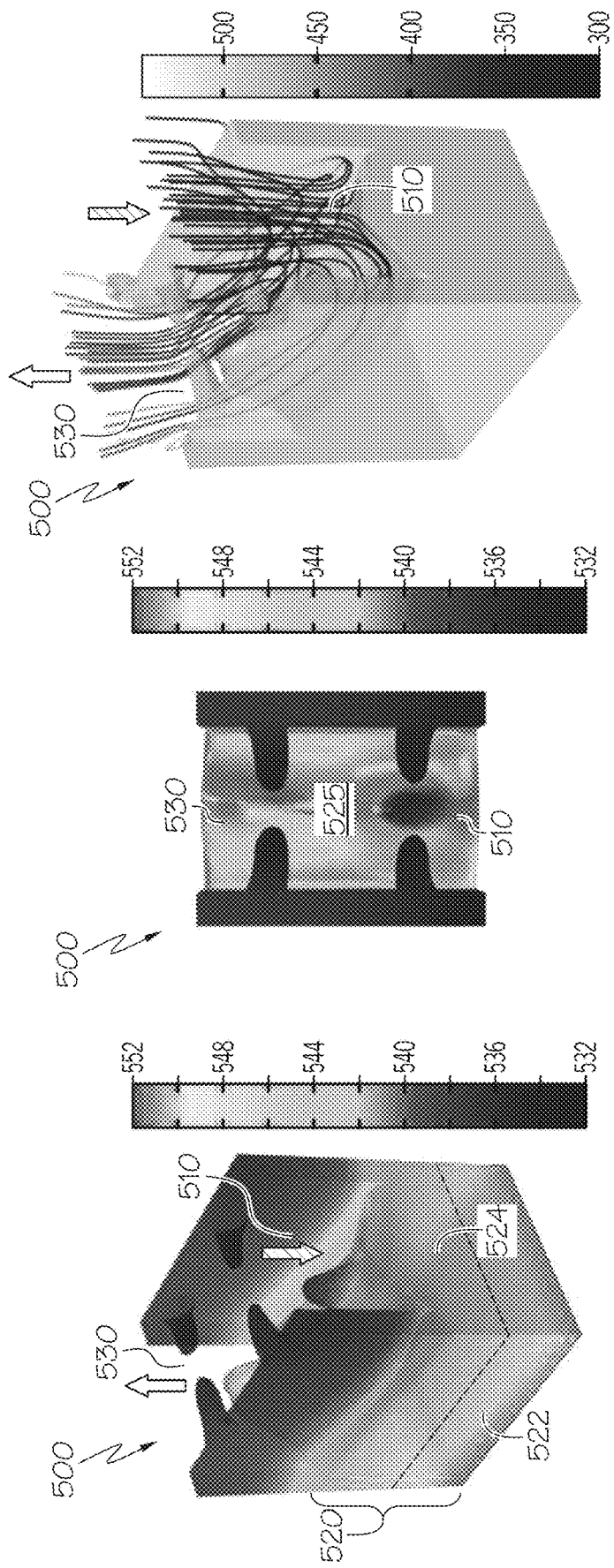

FIN GEOMETRIES FOR MANIFOLD MICROCHANNEL HEAT SINKS

CROSS-REFERENCE TO RELATED APPLICATIONS

This application claims priority to U.S. Provisional Patent Application No. 62/948,544 entitled "Novel Fin Geometries For Manifold Microchannel Heat Sinks" and filed on Dec. 16, 2019, which is hereby incorporated by reference in its entirety.

TECHNICAL FIELD

The present specification generally relates to cooling structures for electronics modules and, more specifically to, manifold microchannel heat sinks having a gridded microchannel assembly with free-form fin geometries for cooling heat-generating devices in the electronics modules.

BACKGROUND

Heat sinking devices may be coupled to a heat-generating device, such as a power electronics device, to remove heat and lower the maximum operating temperature of the heat-generating device. Cooling fluid may be used to receive heat generated by the heat-generating device by convective thermal transfer, and remove such heat from the heat-generating device. For example, cooling fluid may be directed toward a semiconductor-cooling chip to remove heat from the heat-generating device. For small electronic devices such as integrated circuits, a microchannel heat sink may be used to accommodate the small size of these devices.

Power electronics devices are designed to operate at increased power levels and generate increased corresponding heat flux due to the demands of newly-developed electrical systems. Conventional heat sinks may be unable to adequately remove sufficient heat to effectively lower the operating temperature of the electronic assemblies to acceptable temperature levels. Further, conventional heat sinks and cooling structures may require additional bonding layers and thermal matching materials (e.g., bond layers, substrates, thermal interface materials). These additional layers and other factors add packaging size and substantial thermal resistance to the overall electronics modules and make their thermal management challenging.

Due to the trending demand of high efficiency, integrated-functionality and compact form factor, the power density of power electronics devices has been inevitably increasing. As a result, the thermal management of such power-dense electronics modules requires higher heat dissipation capability with balanced pumping power requirement. Accordingly, innovative cooling solutions are desirable to address the thermal management requirements of these power-dense electronics modules.

SUMMARY

The present specification relates to manifold microchannel heat sinks having a gridded microchannel assembly with free-form fin geometries for cooling heat-generating devices in the electronics modules. In one embodiment, a manifold microchannel heat sink includes a target surface and a gridded microchannel assembly comprising a plurality of microchannel cells. Each microchannel cell is surrounded by thermally-conductive sidewalls. Each microchannel cell includes a fluid inlet, a microchannel structure fluidly coupled to the fluid inlet and a fluid outlet fluidly coupled to the microchannel structure. The microchannel structure extends from the target surface and defines a microchannel extending in a normal direction with respect to the target surface. The microchannel structure includes a base plate disposed on the target surface and a three-dimensional fin structure disposed on the base plate. The three-dimensional fin structure has a shape optimized for thermal performance and fluid performance.

In another embodiment, an electronics module is disclosed. The electronics module includes a manifold microchannel heat sink and a semiconductor device thermally coupled to a target surface of the manifold microchannel heat sink. The manifold microchannel heat sink includes the target surface and a gridded microchannel assembly comprising a plurality of microchannel cells. Each microchannel cell is surrounded by thermally-conductive sidewalls. Each microchannel cell includes a fluid inlet, a microchannel structure fluidly coupled to the fluid inlet and a fluid outlet fluidly coupled to the microchannel structure. The microchannel structure extends from the target surface and defines a microchannel extending in a normal direction with respect to the target surface. The microchannel structure includes a base plate disposed on the target surface and a three-dimensional fin structure disposed on the base plate. The three-dimensional fin structure has a shape optimized for thermal performance and fluid performance.

In yet another embodiment, a vehicle includes an electric motor and an electronics module electrically coupled to the electric motor. The electronics module includes a manifold microchannel heat sink and a semiconductor device thermally coupled to a target surface of the manifold microchannel heat sink. The manifold microchannel heat sink includes the target surface and a gridded microchannel assembly comprising a plurality of microchannel cells. Each microchannel cell is surrounded by thermally-conductive sidewalls. Each microchannel cell includes a fluid inlet, a microchannel structure fluidly coupled to the fluid inlet and a fluid outlet fluidly coupled to the microchannel structure. The microchannel structure extends from the target surface and defines a microchannel extending in a normal direction with respect to the target surface. The microchannel structure includes a base plate disposed on the target surface and a three-dimensional fin structure disposed on the base plate. The three-dimensional fin structure has a shape optimized for thermal performance and fluid performance.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 5A depicts an isometric view of an example microchannel cell having a topology-optimized fin structure within the gridded microchannel assembly of the example MMC heat sink, according to one or more embodiments shown and described herein;

FIG. 5B depicts a top view of the example microchannel cell of FIG. 5A, according to one or more embodiments shown and described herein;

FIG. 5C depicts an isometric view of the example microchannel cell of FIG. 5A showing flow paths of a cooling fluid therein, according to one or more embodiments shown and described herein;

DETAILED DESCRIPTION

Various embodiments described herein are directed to manifold microchannel (MMC) heat sinks having a gridded microchannel assembly for cooling heat-generating devices in the electronics modules. The gridded microchannel assembly has a plurality of microchannel cells, where each microchannel cell has a free-form fin geometry that is optimized for thermal performance and fluid performance. The fin structure within each microchannel cell has three-dimensional shapes that are obtained by formulating the heat transfer principles governing the microchannel cells using a density-based topology optimization method and solving with iterative gradient-based optimization. The MMC heat sinks designed with free-form fin geometries have superior thermal and fluid performance in comparison to conventional microchannel heat sinks. Various other aspects of the disclosure and variations thereof are illustrated or implied through the descriptions of the embodiments below.

Figure 1:
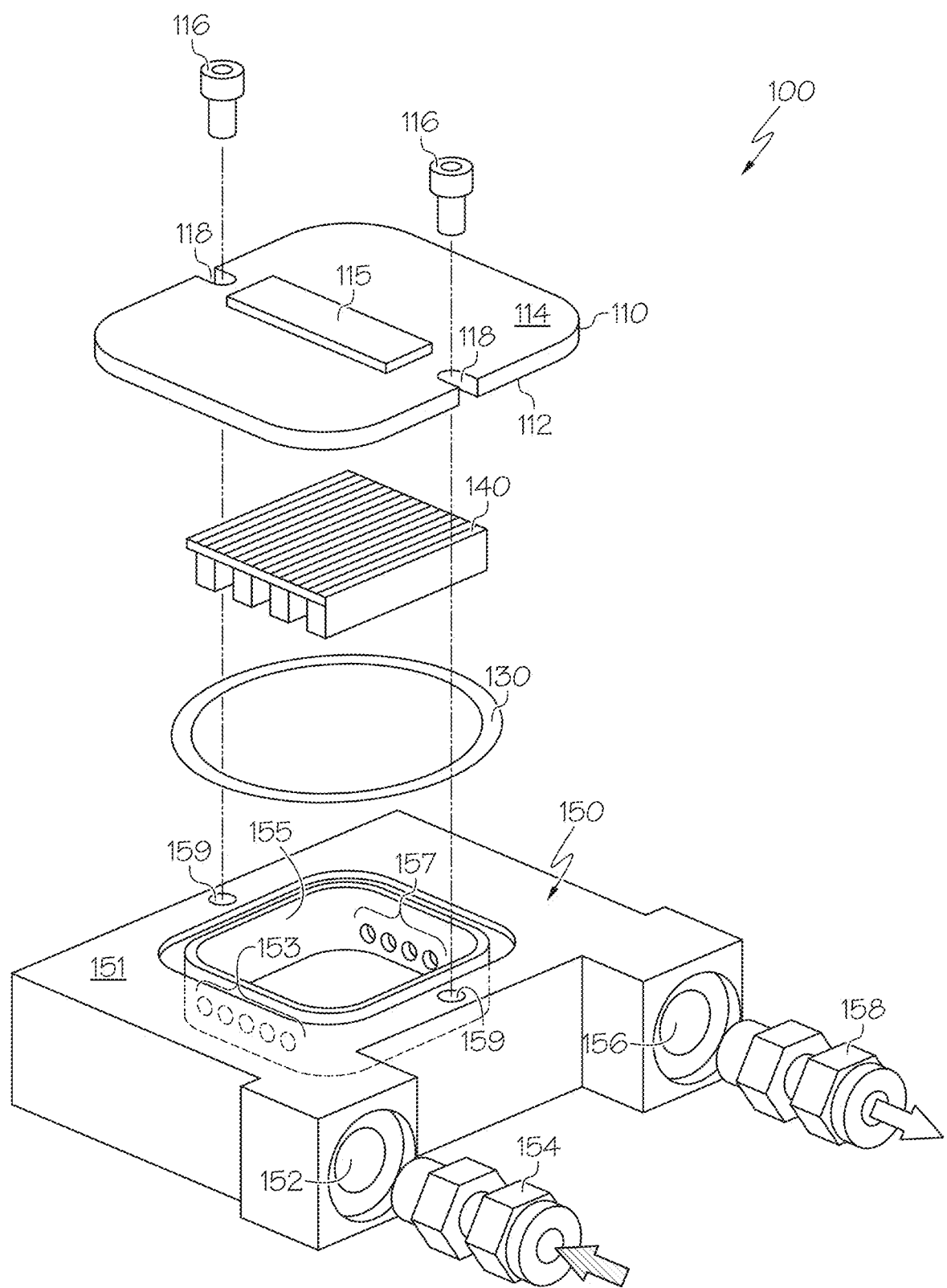
FIG. 1 depicts an exploded perspective view of an example manifold microchannel (MMC) heat sink assembly, according to one or more embodiments shown and described herein.

Referring to the figures, FIG. 1 depicts an exploded perspective view of an example manifold microchannel (MMC) heat sink assembly 100. The MMC heat sink assembly 100 includes an MMC heat sink 110. The MMC heat sink 110 may be made of a thermally-conductive material, such as, but not limited to, aluminum, copper, nickel, and thermally conductive polymers. The MMC heat sink 110 has a target surface 112, two side notches 118 and a substrate surface 114 opposite to the target surface 112. The substrate surface 114 may have copper patterns on which one or more electronic devices 115 can be bonded. The electronic devices 115 may be a heat-generating semiconductor device such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the electronic device 115 may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the electronic devices 115 operate at high current and under high temperatures, for example in excess of 250° C. and generate a large amount of heat flux that should be removed for its continued operation. As heat flows within the MMC heat sink 110 from the substrate surface 114 to the target surface 112, the electronic devices 115 are thermally coupled to the target surface 112

Figure 2:
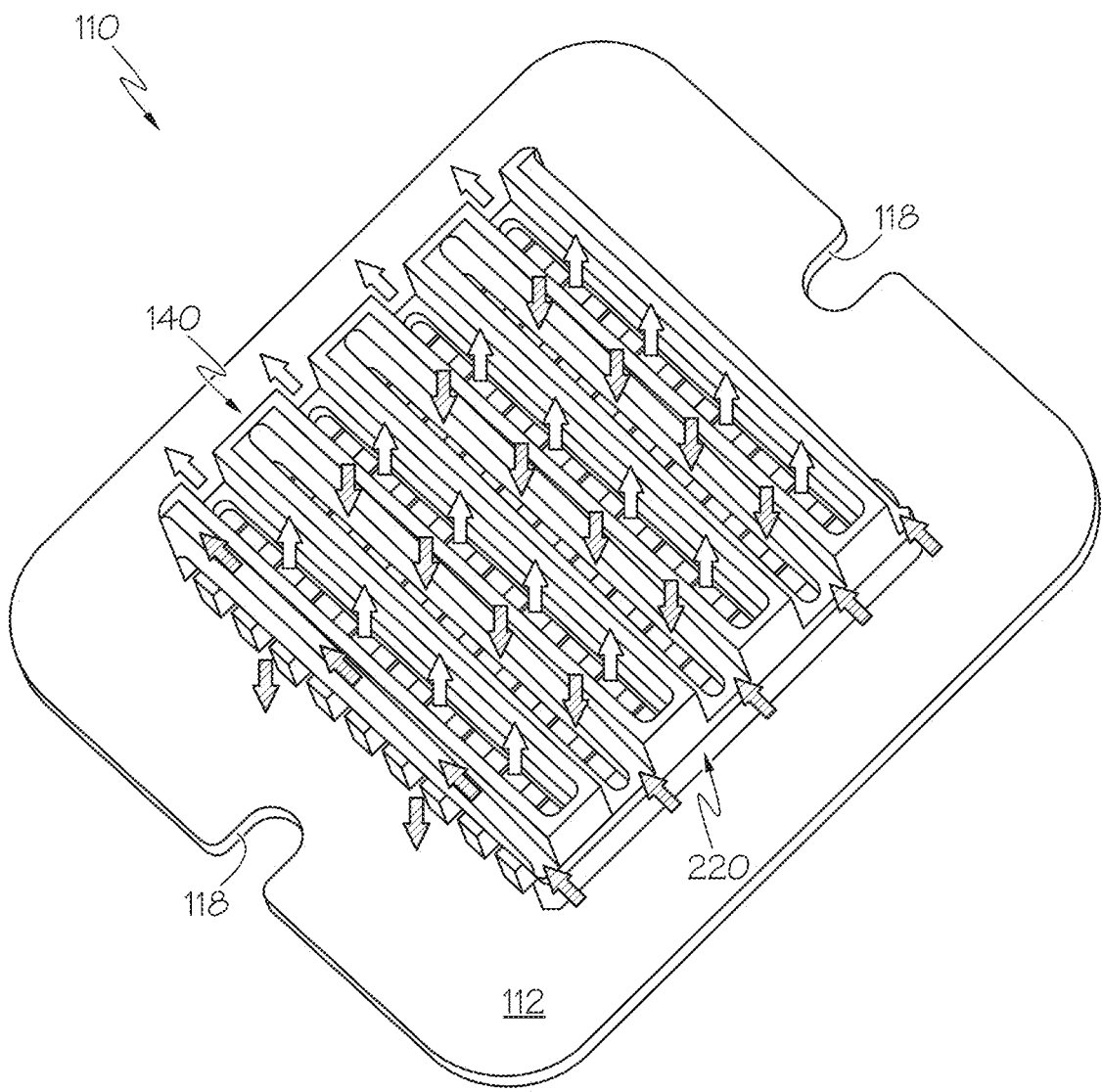
FIG. 2 depicts a top perspective view of an example MMC heat sink of the MMC heat sink assembly of FIG. 1, according to one or more embodiments shown and described herein.
Figure 3B:
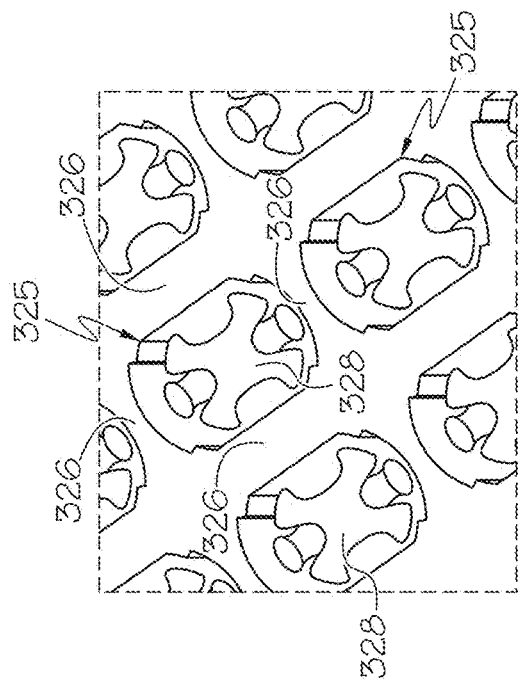
FIG. 3B depicts an expanded view of the gridded microchannel assembly of the example MMC heat sink showing a plurality of microchannel cells, according to one or more embodiments shown and described herein.

The example MMC heat sink 110 further has a gridded microchannel assembly 220 (shown in FIGS. 2-3) and an insert 140. The insert 140 is disposed over the gridded microchannel assembly 220. FIGS. 4A-4B depict an inlet-side perspective view and an outlet-side perspective view respectively of the insert 140. As shown in FIGS. 2 and 4A-4B, the insert 140 has one or more inlet dividers 442, one or more outlet dividers 444 and a base surface 445 through which it is mechanically connected to the gridded microchannel assembly 220 of the MMC heat sink 110. The insert 140 is configured to navigate the flow of a cooling fluid through the inlet dividers 442 and the outlet dividers 444 into the gridded microchannel assembly 220. In the non-limiting embodiment shown in FIGS. 2 and 4A-4B, the inlet dividers 442 and the outlet dividers 444 have an alternating arrangement on the insert 140. Both the flow resistance of the cooling fluid flowing in the gridded microchannel assembly 220 and the temperature variation on the target surface 112 can be significantly minimized with the insert 140 having such an arrangement. The insert 140 may be formed from a thermally-insulating material such as, but not limited to, a plastic material.

Referring again to FIG. 1, the MMC heat sink assembly 100 further includes a heat exchanger manifold 150. The heat exchanger manifold 150 has a top surface 151, an inlet manifold 152 and an outlet manifold 156. The inlet manifold 152 is fitted with an inlet fitting connector 154 and the outlet manifold 156 is fitted with an outlet fitting connector 158. The heat exchanger manifold 150 includes an aperture 155 opening into the top surface 151. The aperture 155 includes one or more inlet holes 153 fluidly connected to the inlet manifold 152 and one or more outlet holes 157 fluidly connected to the outlet manifold 156.

The top surface 151 of the heat exchanger manifold 150 also includes two through-holes 159 aligned with the two notches 118 of the MMC heat sink 110. Two fasteners 116 may be used to pass through the two notches 118 and the two through-holes 159 to mechanically couple the MMC heat sink 110 to the heat exchanger manifold 150 in a way such that the gridded microchannel assembly 220 is sealably disposed within the aperture 155 of the heat exchanger manifold 150 and the inlet dividers 442 and the outlet dividers 444 are fluidly connected to the inlet holes 153 and the outlet holes 157 respectively. In the non-limiting embodiment shown in FIG. 1, the seal used is an O-ring 130. Further, while in the non-limiting embodiment shown in FIG. 1, the MMC heat sink 110 is mechanically coupled to the heat exchanger manifold 150 using two fasteners 116 through the two notches 118 and the two through-holes 159, there may be more than two fasteners 116, notches 118 and through-holes 159 used in other embodiments. Other embodiments may apply other fastening techniques, as well.

A cooling fluid flows from a reservoir (not shown) into the aperture 155 through the inlet manifold 152 and the inlet holes 153, forming an inward flow path. The cooling fluid flows out from the aperture 155 to a heat exchanger (not shown) through the outlet manifold 156 and the outlet holes 157, forming an outward flow path. The cooling fluid is configured to absorb and transfer heat generated from the operation of the electronic device 115. The cooling fluid may be air, an electrically conductive fluid, such as an ethylene glycol mixture, water, etc. or a dielectric cooling fluid that undergoes single-phase cooling. In some embodiments, the cooling fluid may undergo two-phase cooling by transforming from a liquid phase to a vapor phase. In FIGS. 1-2 and 4A-7C, the inward flow path of the cooling fluid is shown in shaded arrow(s), while the outward flow path of the cooling fluid is shown in solid arrows.

FIG. 2 depicts a top perspective view of the example MMC heat sink 110 of the MMC heat sink assembly 100. The MMC heat sink 110 has the gridded microchannel assembly 220 on the target surface 112 and the insert 140 disposed on the gridded microchannel assembly 220. The cooling fluid in the inward flowing path enters the gridded microchannel assembly 220 through the inlet dividers 442 (shown in shaded arrows) and exits the gridded microchannel assembly 220 through the inlet dividers 444 (shown in solid arrows). Thus the insert 140 provides the cooling fluid to the gridded microchannel assembly 220 and also receives and removes the cooling fluid from the gridded microchannel assembly 220.

Figure 3A:
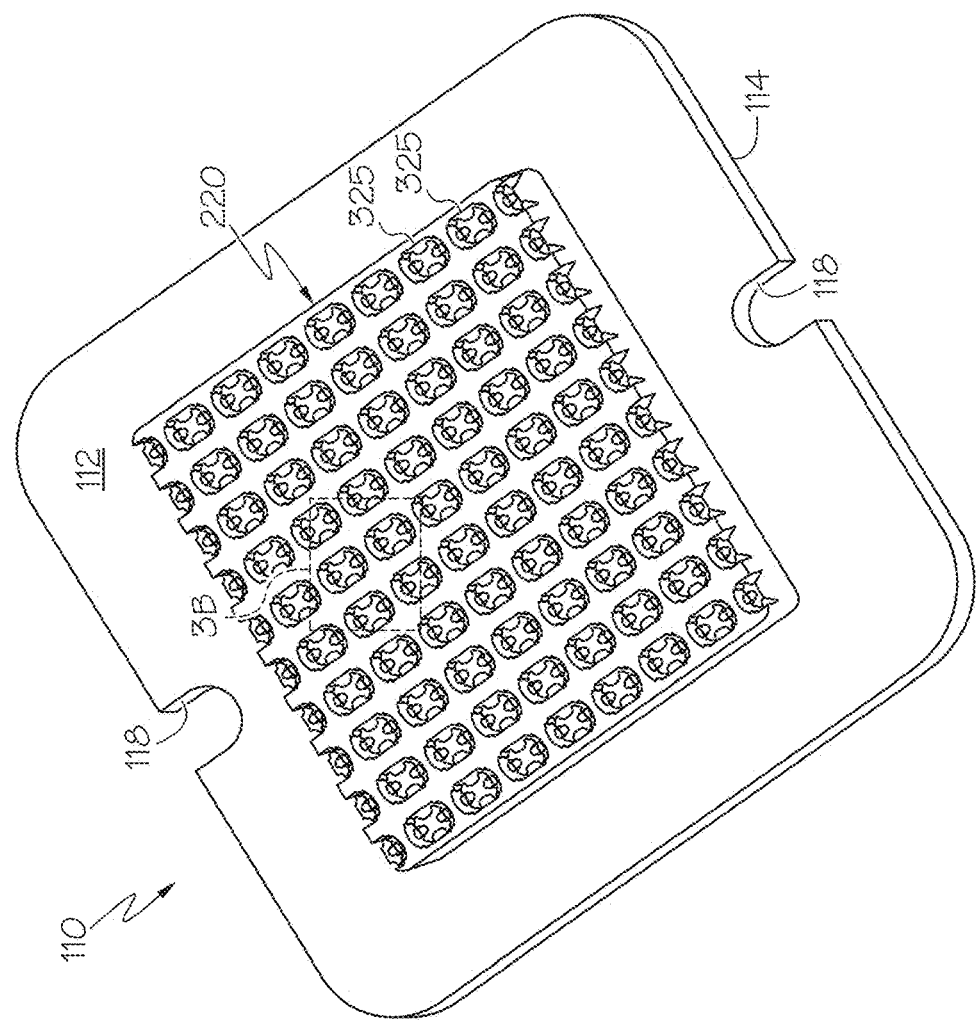
FIG. 3A depicts a top perspective view of the example MMC heat sink with a gridded microchannel assembly, according to one or more embodiments shown and described herein.
Figure 4A:
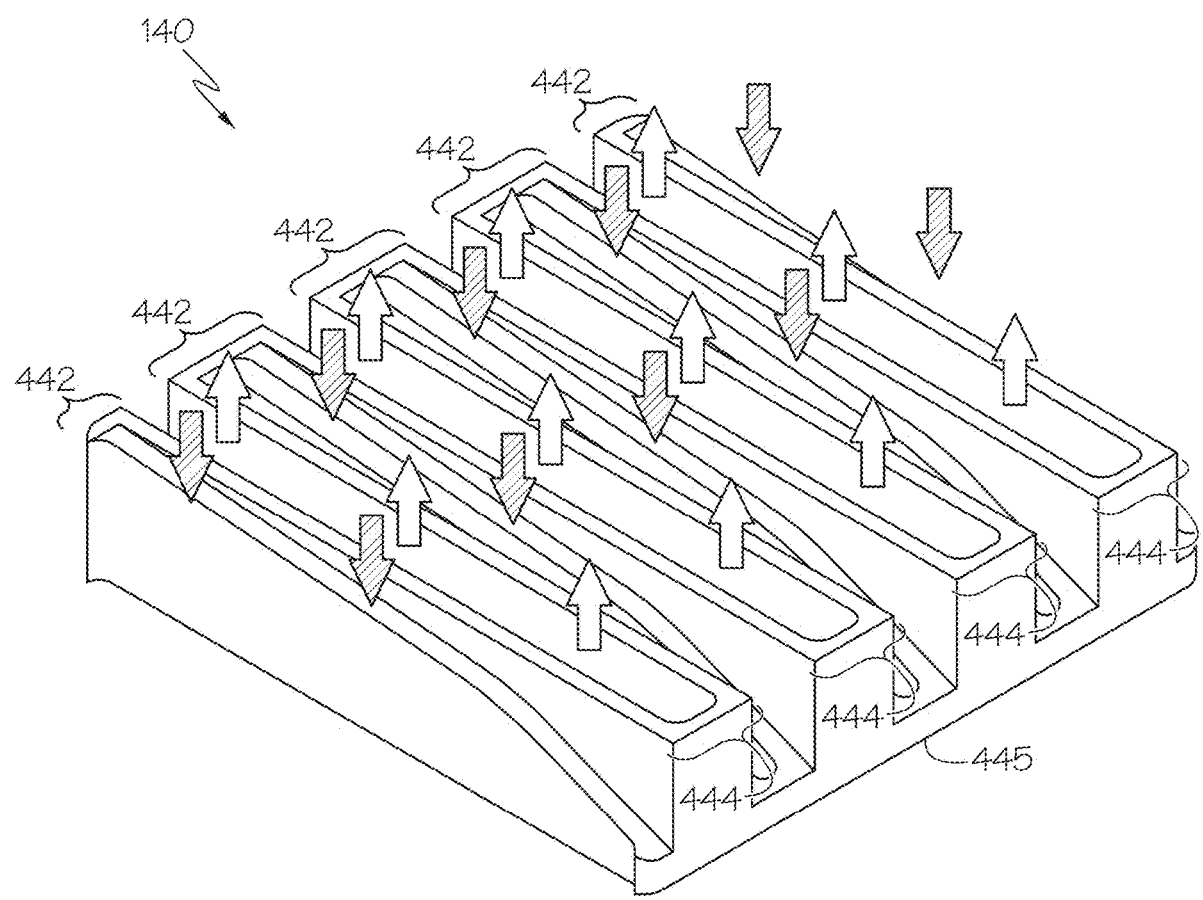
FIG. 4A depicts an inlet-side perspective view of an example insert disposed over the gridded microchannel assembly, according to one or more embodiments shown and described herein.
Figure 4B:
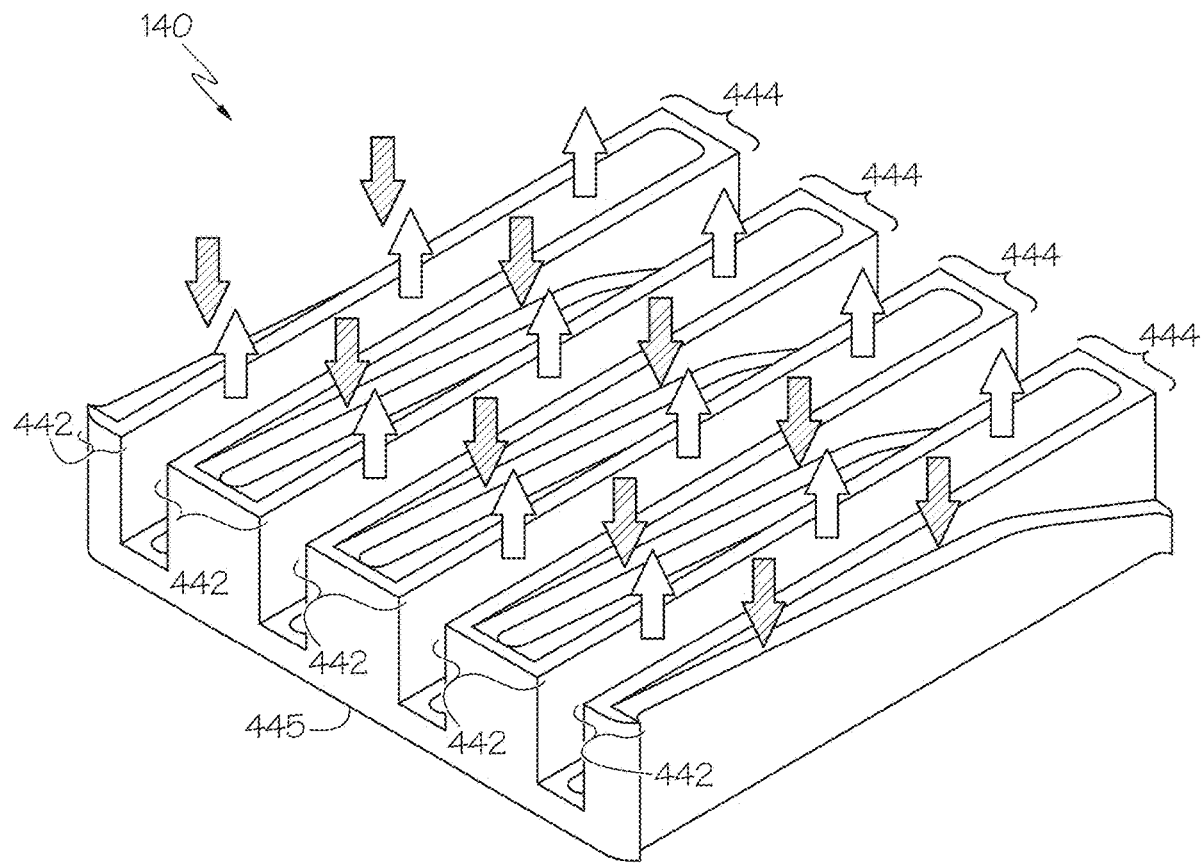
FIG. 4B depicts an outlet-side perspective view of an example insert disposed over the gridded microchannel assembly, according to one or more embodiments shown and described herein.

FIG. 3A depicts a top perspective view of the example MMC heat sink 110 with the gridded microchannel assembly 220. The gridded microchannel assembly 220 has a plurality of microchannel cells 325, as further shown in the expanded view of the gridded microchannel assembly 220 in FIG. 3B. In some embodiments, each microchannel cell 325 is surrounded by thermally-conductive sidewalls 326. Each microchannel cell 325 has a three-dimensional microchannel structure 328 that defines a microchannel extending in a normal direction with respect to the target surface 112.

However, in other embodiments, the microchannel cells 325 are fluidly coupled to one another. The number of microchannel cells 325 may depend on a variety of factors, such as the size of the semiconductor device, the amount of heat flux generated, etc. Individual microchannel cells 325 have microchannel structures 520, 620, 720 having three-dimensional fin structures 524, 624, 724 defining microchannels 525, 625, 725 as illustrated in FIGS. 5A-5C. FIGS. 6A-6C and FIGS. 7A-7C respectively. Each of the microchannel cells 500, 600, 700 have fluid inlets 510, 610, 710, microchannel structures 520, 620, 720 and fluid outlets 530, 630, 730 respectively.

In some embodiments, the shape configuration of the three-dimensional fin structures 524, 624, 724 may be achieved by formulating the heat transfer principles governing the microchannel cells 500, 600, 700 using a density-based topology optimization method and solving with iterative gradient-based optimization, as described below. In other embodiments, the shape configuration may be achieved through a combination of pin-fins and plate-fin structures and may extend orthogonally or at any angles with respect to the target surface 112. Regardless, the shape, number, and arrangement of the three-dimensional fin structures 524, 624, 724 may be designed such that the cooling fluid in the microchannels 525, 625, 725 has a lower pressure drop and a higher rate of heat transfer than provided by straight, uniform microchannels. In some embodiments, the microchannels 525, 625, 725 may have high aspect ratio defined as its height divided by its width.

The three-dimensional fin structures 524, 624, 724 may be fabricated from a thermally-conductive metal such as, but not limited to, copper, nickel, and aluminum using advanced manufacturing processes such as, but not limited to, three-dimensional printing, rapid investment casting, and additive manufacturing.

The shape of the three-dimensional fin structures 524, 624, 724 may be designed by formulating the heat transfer principles governing the microchannel cells 500, 600, 700 using a density-based topology optimization method and solving with iterative gradient-based optimization. While continuous values (i.e., "blurry" geometry) are allowed during the course of optimization, discrete convergence (i.e., "crispy" geometry) is encouraged via interpolation functions and achieved via iterative gradient-based methods at the end of optimization. The three-dimensional fin structures 524, 624, 724 has a design domain D, having solid and fluid components (i.e. the three-dimensional fin structures 524, 624, 724 and the microchannels 525, 625, 725). A characteristic function $\chi$ is defined to describe the microchannel domain $\Omega_c$ to be optimized:

$$\chi(x)=0 \text{ for all } x \varepsilon D/\Omega_c \text{ and } \chi(x)=1 \text{ for all } x \varepsilon \Omega_c \quad (1),$$

where x is a design point in the design domain D and $\chi(x)$ is defined by a scalar function $\Phi$ and a Heaviside function H such that:

$$\chi(x)=H(\Phi(x))0 \text{ for all } x \varepsilon D \backslash \Omega_c \text{ and } \chi(x)=1 \text{ for all } x \varepsilon \Omega_c \quad (2).$$

The scalar function is regularized through a Helmholtz Partial Differential Equation (PDE) filter such that:

$$-(R_\Phi)^2 \tau^2 \tilde{\Phi} + \tilde{\Phi} = \Phi \quad (3)$$

where $R_\Phi$ is the filter radius.

The regularized nodal design variable $\gamma$ is then defined by an additional smoothed Heaviside function $\tilde{H}$ such that:

$$\gamma = \tilde{H}(\tilde{\Phi}) \quad (4)$$

After the regularization $\Phi \rightarrow \tilde{\Phi} \rightarrow \gamma$, the resulting regularized nodal design variable $\gamma$ is bounded between 0 and 1 where $\gamma=0$ indicates solid component in the three-dimensional fin structures 524, 624, 724 and $\gamma=1$ indicates fluid component in the microchannels 525, 625, 725. In a practical optimization formulation, the original nodal design variable $\Phi$ can be bounded between −1 and 1.

In the example MMC heat sink 110, the heat transfer physics is governed by conduction in solid component and (primarily) convection in the fluid components in the design domain D—a phenomenon known as conjugate heat transfer. The equilibrium equations governing the flow physics (assuming incompressible laminar flow in porous media) can be summarized as:

$$\rho(u \cdot \nabla)u = -\nabla p + \nabla \cdot (\mu(\Delta u + (\nabla u)^T)) - \mu\alpha(\gamma)u, \text{ and } \nabla \cdot (u) = 0 \quad (5),$$

where $\rho$ is the fluid density, u is the fluid velocity (state variable), p is the pressure (state variable), $\mu$ is the fluid dynamic viscosity, $\alpha(\gamma)$ is the effective inverse permeability, which is a function of the regularized design variable $\gamma$, and defined as:

$$\alpha(\gamma) = \alpha_{min} + (\alpha_{max} - \alpha_{min}) \cdot [(q_\alpha(1-\gamma))/(q_\alpha + \gamma)] \quad (6),$$

where $q_\alpha$ is a tuning parameter controlling the function convexity.

As $\gamma$ approaches 0, $\alpha(\gamma)$ approaches $\alpha_{max}$ indicating a low permeability quasi-solid state. As $\gamma$ approaches 1, $\alpha(\gamma)$ approaches $\alpha_{min}$ indicating a fluid state.

The equilibrium equation governing the heat conduction and convention physics is summarized as:

$$\rho c u \cdot \nabla T = \nabla \cdot (k(\gamma)\nabla T) \quad (7).$$

where c is the fluid specific heat capacity, T is the temperature (state variable), $k(\gamma)$ is the effective thermal conductivity, which is a function of the regularized design variable $\gamma$.

The effective thermal conductivity interpolation function is defined as:

$$k(\gamma) = [\gamma(C_k(1+q_k)-1)+1]/[C_k(1+q_k\gamma)] \quad (8).$$

$$\text{where } C_k = k_f/k_s \quad (9).$$

$k_f$ is the thermal conductivity of fluids, $k_s$ is the thermal conductivity of solids and $q_k$ is a tuning parameter controlling the function convexity.

During the topology optimization process, a multi-objective function F of the regularized design variable $\gamma$ is used. The multi-objective function F is defined as a weighted linear combination of the flow resistance $f_1$ of the cooling fluid and the average temperature $f_2$ at the target surface 112 such that:

$$F(\gamma) = w_1 * f_1 + w_2 * f_2, \quad (10)$$

$$\text{where } f_1 = \int_D \left( \frac{1}{2} \mu \sum_{i,j} \left( \frac{\delta u i}{\delta x j} + \frac{\delta u j}{\delta x i} \right) + \mu \sum_i \alpha(\gamma) u_1^2 \right) \cdot d\Omega, \quad (11)$$

and $$f_2 = \int_{\Gamma b} T \cdot d\Omega \quad (12)$$

$w_1$ and $w_2$ are weighting factors which balance the fluid performance and thermal performance of the topology-optimized designs.

During this topology optimization process, the multi-objective function is minimized subject to the conditions below. The overall optimization formulation can be summarized as:

minimize: $F(\gamma)$, subject to $\Phi \in [-1,1]^D$, design variable regularization, physics equilibrium (13), where $\Phi$ is the nodal design variable ranging between −1 and 1 in the design domain D and regularized into $\gamma$ as per equations (3) and (4); $F(\gamma)$ is the weighted multi-objective function as per equations (10), (11) and (12); and the physics equilibrium governing the conjugate heat transfer is detailed in equations (5), (6), (7), (8) and (9).

The physics equilibrium may be solved using a finite element method using a multiphysics modeling software such as, but not limited to, COMSOL®. The iterative update of the nodal design variable $\Phi$ may be computed using the method of moving asymptotes using a computational software such as, but not limited to, MATLAB®. The sensitivity analysis following the standard adjoint method, which can be implemented in COMSOL® with automatic differentiation. COMSOL®-MATLAB® Livelink is used to communicate between the two computing platforms. The topology-optimized designs of the three-dimensional fin structures 524, 624, 724 are then post-processed with separately modeled fluid and solid domains in order to guarantee accurate numerical analysis by avoiding any fluid seepage into the solid domain. The Boolean operation is used to appropriately model the surface boundary between the fluid and the solid domains. Further, the material properties shown in Table I are assumed during simulation of thermal performance and fluid performance. As described herein, thermal performance is measured by the average temperature difference between the target surface 112 and the cooling fluid in the fluid inlet 510, 610, 710 and this average temperature difference is inversely proportional to the heat transfer coefficient of the microchannel cells 500, 600, 700 for a given heat flux. As described herein, fluid performance is described as measured by pressure drop and directly proportional to the required pumping power. Fluids are supplied at a constant flow rate of 0.25 L/min with a fixed temperature of 338.15K at the fluid inlets 510, 610, 710 and the base plate 522, 622, 722 is uniformly heated with a heat flux of 100 W/cm$^2$. For purposes of the simulation, it is further assumed the base plate 522, 622.722 is 2 mm thick, the insert 140 has four inlet dividers 442 and four outlet dividers 444 and the area on the target surface 112 for topology-optimization of the three-dimensional fin structures 524, 624, 724 is 36 mm×36 mm such that there are one hundred and sixty (160) microchannel cells 325 disposed on the target surface 112.

TABLE I

Material Properties

| Property | Symbol | Value | Unit |
|---|---|---|---|
| Fluid density (50-50 water ethylene glycol) | $\rho$ | 1003.5 | Kg/m$^3$ |
| Fluid dynamic viscosity (50-50 water ethylene glycol) | $\mu$ | 0.00065 | Pa · s |
| Fluid thermal conductivity (50-50 water ethylene glycol) | $k_f$ | 0.4267 | W/(m · K) |
| Fluid specific heat capacity (50-50 water ethylene glycol) | c | 3662.2 | J/(Kg · K) |
| Solid thermal conductivity (Copper) | $k_s$ | 400 | W/(m · K) |

Figures 6A, 6B, 6C:
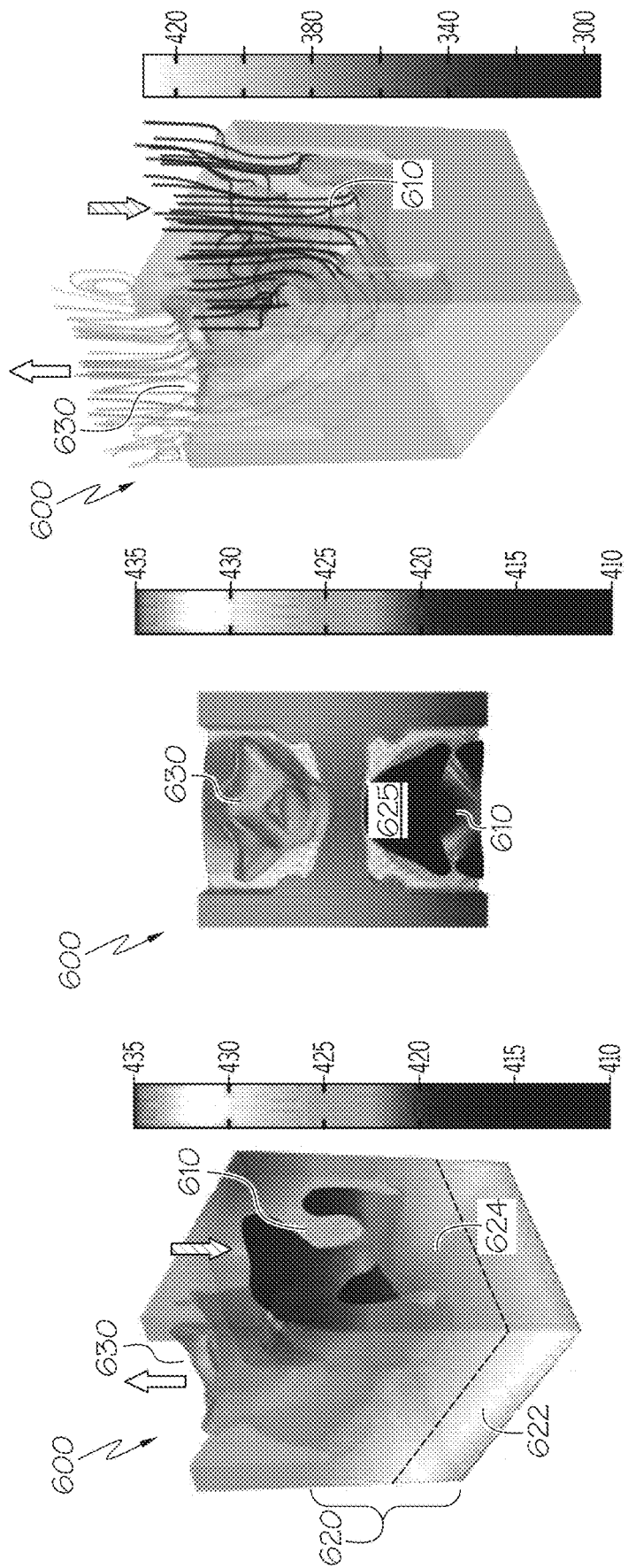
FIG. 6A depicts an isometric view of another example microchannel cell having a topology-optimized fin structure within the gridded microchannel assembly of the example MMC heat sink, according to one or more embodiments shown and described herein.
FIG. 6B depicts a top view of the example microchannel cell of FIG. 6A, according to one or more embodiments shown and described herein.
FIG. 6C depicts an isometric view of the example microchannel cell of FIG. 6A showing flow paths of a cooling fluid therein, according to one or more embodiments shown and described herein.
Figures 7A, 7B, 7C:
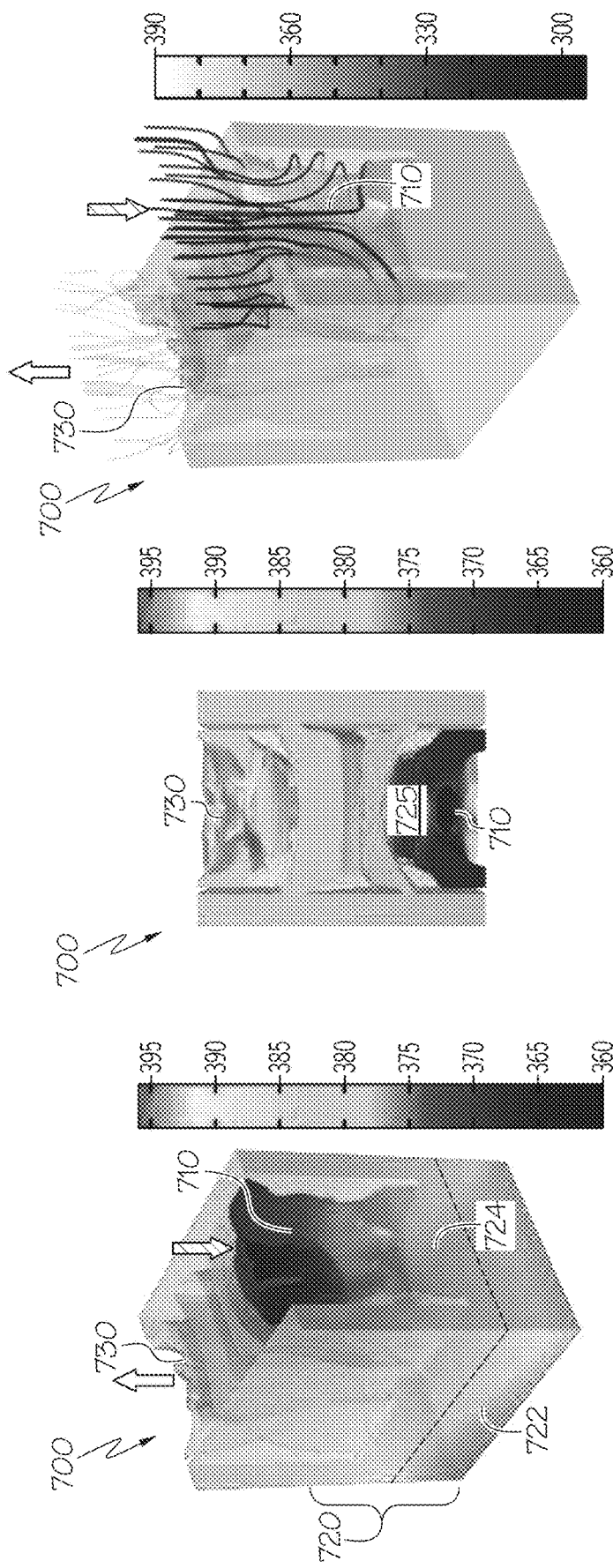
FIG. 7A depicts an isometric view of yet another example microchannel cell having a topology-optimized fin structure within the gridded microchannel assembly of the example MMC heat sink, according to one or more embodiments shown and described herein.
FIG. 7B depicts a top view of the example microchannel cell of FIG. 7A, according to one or more embodiments shown and described herein.
FIG. 7C depicts an isometric view of the example microchannel cell of FIG. 7A showing flow paths of a cooling fluid therein, according to one or more embodiments shown and described herein.

The different shapes of the three-dimensional fin structures 524, 624, 724 in FIGS. 5-7 are due to the use of different weighting factors, $w_1$ and $w_2$ to meet different design goals. As the setting of $w_2/w_1$ increases, the optimized design favors more of the thermal performance over the fluid performance. The different ratios of the chosen weighting factors, $w_1$ and $w_2$ in the three topology-optimized designs demonstrate different levels of the tradeoff between thermal performance and fluid performance. Larger volume fraction of the solid component in the design domain D generally leads to better thermal performance due to expansion of the solid-fluid interface area and the increase of more conductive solid material. At the same time, the pressure drop also increases with narrowed flow path of the cooling fluid in the microchannels 525, 625, 725 due to higher volume fraction of solid component. In all three cases of FIGS. 5A-5C, 6A-6C and 7A-7C however, the topology-optimized designs of the three-dimensional fin structures 524, 624, 724 have improved thermal and fluid performances than conventional microchannel heat sinks with straight rectangular fins.

FIGS. 5A-5B depict an isometric view and a top view respectively of an example microchannel cell 500 having a microchannel structure 520, where the weighting factor ratio $w_2/w_1=0.33$. FIG. 5C depicts an isometric view of the example microchannel cell 500 of FIG. 5A showing flow paths of a cooling fluid therein. The microchannel cell 500 has the fluid inlet 510, the microchannel structure 520 fluidly coupled to the fluid inlet 510 and the fluid outlet 530. The fluid inlet 510 within each microchannel cell 500 of the gridded microchannel assembly 220 can be fluidly coupled to the inlet manifold 152 of the heat exchanger manifold 150 through the insert 140 and the inlet holes 153. The fluid outlet 530 within each microchannel cell 500 of the gridded microchannel assembly 220 can be fluidly coupled to the outlet manifold 156 of the heat exchanger manifold 150 through the insert 140 and the outlet holes 157.

The microchannel structure 520 is disposed on the target surface 112 and extends therefrom to define a microchannel 525, which thus expands in a normal direction with respect to the target surface 112. The microchannel 525 provides a flow path for the cooling fluid in both parallel and normal directions with respect to the target surface 112. The microchannel structure 520 includes the base plate 522 disposed on the target surface 112 and the three-dimensional fin structure 524 disposed on the base plate 522. The three-dimensional fin structure 524 has a topology-optimized shape configured to maximize fluid performance over thermal performance of the microchannel structure 520.

FIGS. 6A-6B depict an isometric view and a top view respectively of another example microchannel cell 600 having a microchannel structure 620, where the weighting factor ratio $w_2/w_1=2$. FIG. 6C depicts an isometric view of the example microchannel cell 600 of FIG. 6A showing flow paths of a cooling fluid therein. The microchannel cell 500 has the fluid inlet 610, the microchannel structure 620 fluidly coupled to the fluid inlet 610 and the fluid outlet 630. The fluid inlet 610 within each microchannel cell 600 of the gridded microchannel assembly 220 can be fluidly coupled to the inlet manifold 152 of the heat exchanger manifold 150 through the insert 140 and the inlet holes 153. The fluid outlet 630 within each microchannel cell 600 of the gridded microchannel assembly 220 can be fluidly coupled to the outlet manifold 156 of the heat exchanger manifold 150 through the insert 140 and the outlet holes 157.

The microchannel structure 620 is disposed on the target surface 112 and extends therefrom to define a microchannel 625, which thus expands in a normal direction with respect to the target surface 112. The microchannel 625 provides a flow path for the cooling fluid in both parallel and normal directions with respect to the target surface 112. The microchannel structure 620 includes the base plate 622 disposed on the target surface 112 and the three-dimensional fin structure 624 disposed on the base plate 622. The three-dimensional fin structure 624 has a topology-optimized shape configured to balance fluid performance and thermal performance of the microchannel structure 620.

FIGS. 7A-7B depict an isometric view and a top view of yet another example microchannel cell 700 having a microchannel structure 720, where the weighting factor ratio $w_2/w_1=100$. FIG. 7C depicts an isometric view of the example microchannel cell 700 of FIG. 7A showing flow paths of a cooling fluid therein. The microchannel cell 700 has the fluid inlet 710, the microchannel structure 720 fluidly coupled to the fluid inlet 710 and the fluid outlet 730. The fluid inlet 710 within each microchannel cell 700 of the gridded microchannel assembly 220 can be fluidly coupled to the inlet manifold 152 of the heat exchanger manifold 150 through the insert 140 and the inlet holes 153. The fluid outlet 730 within each microchannel cell 700 of the gridded microchannel assembly 220 can be fluidly coupled to the outlet manifold 156 of the heat exchanger manifold 150 through the insert 140 and the outlet holes 157.

The microchannel structure 720 is disposed on the target surface 112 and extends therefrom to define a microchannel 725, which thus expands in a normal direction with respect to the target surface 112. The microchannel 725 provides a flow path for the cooling fluid in both parallel and normal directions with respect to the target surface 112. The microchannel structure 720 includes the base plate 722 disposed on the target surface 112 and the three-dimensional fin structure 724 disposed on the base plate 722. The three-dimensional fin structure 724 has a topology-optimized shape configured to maximize thermal performance over fluid performance of the microchannel structure 720.

In operation, the cooling fluid flows through the inlet manifold 152 and the inlet holes 153 along the inward flow path into the MMC heat sink 110. The cooling fluid flows through the inlet dividers 442 and down into each microchannel cell 325 of the gridded microchannel assembly 220 until it impinges on multiple impingement regions of the microchannels 525, 625, 725. The coolant fluid flows down and up through the microchannels 525, 625, 725 as shown in the flow paths of the FIGS. 5C, 6C and 7C respectively and often impinges on the sidewalls of the microchannels 525, 625, 725 on the three-dimensional fin structures 524, 624, 724. Subsequently, the cooling fluid is then forced into changing its direction by about 90 degrees towards the outlet dividers 444 of the insert 140 which is fluidly connected to the low pressure area in the outlet manifold 156. The cooling fluid flows upwards through the outlet dividers 444 in a direction normal to the target surface 112 and then flows along the outward flow path of the MMC heat sink 110 through the outlet holes 157 exits out of the outlet manifold 156.

Figure 8:
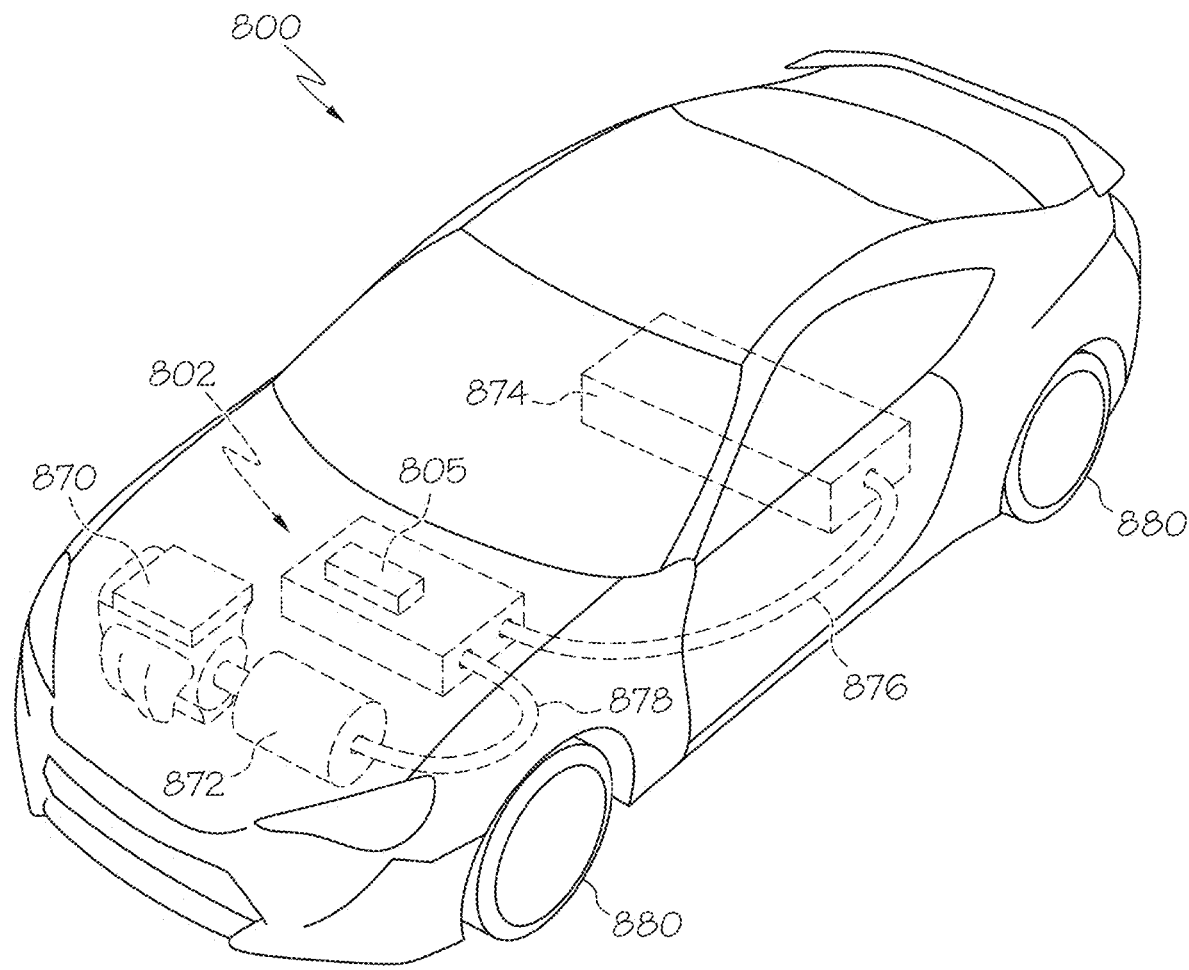
FIG. 8 schematically depicts a vehicle having an electric motor electrically coupled to an electronics module having the example MMC heat sink with the gridded microchannel assembly, according to one or more embodiments described and illustrated herein.

As stated above, the electronic modules having embodiments of the MMC heat sinks described herein may be incorporated into larger power electronic circuits, such as inverter and/or converter circuits of an electrified vehicle. The electrified vehicle may be a hybrid vehicle, a plug-in electric hybrid vehicle, an electric vehicle, or any vehicle that utilizes an electric motor. Referring now to FIG. 8, a vehicle 800 configured as a hybrid vehicle or a plug-in hybrid vehicle is schematically illustrated. The vehicle generally comprises a gasoline engine 870 and an electric motor 872, both of which are configured to provide rotational movement to the wheels 880 of the vehicle 800 to propel the vehicle 800 down the road. A power electronic circuit 802 is electrically coupled to electric motor 872 (for example, by conductors 878). The power electronic circuit 802 may be configured as an inverter and/or a converter circuit that provides electrical power to the electric motor 872. The power electronic circuit 802 may in turn be electrically coupled to a power source, such as a battery pack 874 (for example, by conductors 876). The power electronic circuit 802 includes one or more electronics modules 805 having the example MMC heat sink 110 with the gridded microchannel assembly 220, as described above.

The manifold microchannel heat sinks having a gridded microchannel assembly with free-form fin geometries can be advantageously used for cooling heat-generating devices in the electronics modules. The free-form fin geometries create three-dimensional shapes that help reduce pumping power in regions with less heat flux and increase thermal performance in regions with more heat flux, thereby optimally balancing the tradeoff between pumping power and thermal performance.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A manifold microchannel heat sink comprising:
   a target surface;
   a gridded microchannel assembly comprising a plurality of microchannel cells, wherein each microchannel cell comprises:
      a fluid inlet;
      a microchannel structure fluidly coupled to the fluid inlet, the microchannel structure extending from the target surface and defining a microchannel extending in a normal direction with respect to the target surface, wherein the microchannel structure comprises:
         a base plate disposed on the target surface; and
         a three-dimensional fin structure disposed on the base plate;
      a fluid outlet fluidly coupled to the microchannel structure, and
   an insert disposed over the gridded microchannel assembly comprising a plurality of laterally extending inlet dividers and a plurality of laterally extending outlet dividers interlaced with the plurality of extending inlet dividers.

2. The manifold microchannel heat sink of claim 1, wherein the insert is formed from a thermally-insulating material.

3. The manifold microchannel heat sink of claim 1, wherein the three-dimensional fin structure is formed from one or more of the following: copper, nickel, and aluminum.

4. The manifold microchannel heat sink of claim 1, wherein the three-dimensional fin structure is fabricated using one or more of the following: three-dimensional printing, rapid investment casting, and additive manufacturing.

5. The manifold microchannel heat sink of claim 1, wherein the microchannel provides a flow path of the cooling fluid in both parallel and normal directions with respect to the target surface.

6. An electronics module comprising:
   a manifold microchannel heat sink comprising:
      a target surface;
      a gridded microchannel assembly comprising a plurality of microchannel cells, wherein each microchannel cell comprises:
         a fluid inlet;
         a microchannel structure fluidly coupled to the fluid inlet, the microchannel structure extending from the target surface and defining a microchannel extending in a normal direction with respect to the target surface, wherein the microchannel structure comprises:
            a base plate disposed on the target surface; and
            a three-dimensional fin structure disposed on the base plate; and
         a fluid outlet fluidly coupled to the microchannel structure;
      an insert disposed over the gridded microchannel assembly comprising a plurality of laterally extending inlet dividers and a plurality of laterally extending outlet dividers interlaced with the plurality of extending inlet dividers; and
   a semiconductor device thermally coupled to the target surface.

7. The electronics module of claim 6, wherein the insert is formed from a thermally-insulating material.

8. The electronics module of claim 6, wherein the three-dimensional fin structure is formed from one or more of the following: copper, nickel, and aluminum.

9. The electronics module of claim 6, wherein the three-dimensional fin structure is fabricated using one or more of the following: three-dimensional printing, rapid investment casting, and additive manufacturing.

10. The electronics module of claim 6, wherein the gridded microchannel assembly is sealably disposed within a heat exchanger manifold having an inlet manifold and an outlet manifold such that the inlet manifold is fluidly coupled to the fluid inlet and the outlet manifold is fluidly coupled to the fluid outlet.

11. The electronics module of claim 6, wherein the microchannel provides a flow path of the cooling fluid in both parallel and normal directions with respect to the target surface.

12. A vehicle comprising:
   an electric motor; and
   an electronics module electrically coupled to the electric motor, the electronics module comprising:
      a manifold microchannel heat sink comprising:
         a target surface;
         a gridded microchannel assembly comprising a plurality of microchannel cells, wherein each microchannel cell comprises:
            a fluid inlet;
            a microchannel structure fluidly coupled to the fluid inlet, the microchannel structure extending from the target surface and defining a microchannel extending in a normal direction with respect to the target surface, wherein the microchannel structure comprises:
a base plate disposed on the target surface; and
a three-dimensional fin structure disposed on the base plate; and
a fluid outlet fluidly coupled to the microchannel structure;
an insert disposed over the gridded microchannel assembly comprising a plurality of laterally extending inlet dividers and a plurality of laterally extending outlet dividers interlaced with the plurality of extending inlet dividers; and
a semiconductor device thermally coupled to the target surface.

13. The vehicle of claim 12, wherein the insert is formed from a thermally-insulating material.

14. The vehicle of claim 12, wherein the three-dimensional fin structure is formed from one or more of the following: copper, nickel, and aluminum.

15. The vehicle of claim 12, wherein the three-dimensional fin structure is fabricated using one or more of the following: three-dimensional printing, rapid investment casting, and additive manufacturing.

16. The vehicle of claim 12, wherein the gridded microchannel assembly is sealably disposed within a heat exchanger manifold having an inlet manifold and an outlet manifold such that the inlet manifold is fluidly coupled to the fluid inlet and the outlet manifold is fluidly coupled to the fluid outlet.

17. The vehicle of claim 12, wherein the microchannel provides a flow path of the cooling fluid in both parallel and normal directions with respect to the target surface.

18. The manifold microchannel heat sink of claim 1, wherein the three-dimensional fin structure has a free-form shape in three dimensions.

19. The electronics module of claim 6, wherein the three-dimensional fin structure has a free-form shape in three dimensions.

20. The vehicle of claim 12, wherein the three-dimensional fin structure has a free-form shape in three dimensions.

* * * * *

UNITED STATES PATENT AND TRADEMARK OFFICE
CERTIFICATE OF CORRECTION

PATENT NO. : 11,428,478 B2
APPLICATION NO. : 16/777315
DATED : August 30, 2022
INVENTOR(S) : Yuqing Zhou, Ercan M. Dede and Tsuyoshi Nomura Page 1 of 1

It is certified that error appears in the above-identified patent and that said Letters Patent is hereby corrected as shown below:

On the Title Page

Item (54), delete "FIN GEOMETRIES FOR MANIFOLD MICROCHANNEL HEAT SINKS" and insert --NOVEL FIN GEOMETRIES FOR MANIFOLD MICROCHANNEL HEAT SINKS--, therefor.

In the Specification

In Column 1, Line(s) 1 & 2, title, delete "FIN GEOMETRIES FOR MANIFOLD MICROCHANNEL HEAT SINKS" and insert --NOVEL FIN GEOMETRIES FOR MANIFOLD MICROCHANNEL HEAT SINKS--, therefor.

In Column 6, Line(s) 61, delete "$-(R_\Phi)^2\nabla^2\tilde{\Phi} + \tilde{\Phi} = \Phi$," and insert --$-(R_\Phi)^2\nabla^2\tilde{\Phi}+\tilde{\Phi}=\Phi$--, therefor.

In Column 7, Line(s) 16, delete "$\rho(u \cdot \nabla)u = -\nabla p + \nabla \cdot (\mu(\nabla u + (\nabla u)^T)) - \mu\alpha(\gamma)u$, and $\nabla \cdot (u)=0$," and insert --$\rho(u \cdot \nabla)u=-\nabla p+\nabla \cdot (\mu(\Delta u+(\nabla u)^T))-\mu\alpha(\gamma)u$, and $\nabla \cdot (u)=0$--, therefor.

Signed and Sealed this
Fifteenth Day of November, 2022

Katherine Kelly Vidal
*Director of the United States Patent and Trademark Office*